US010693492B1

(12) United States Patent
Lasserre et al.

(10) Patent No.: US 10,693,492 B1
(45) Date of Patent: Jun. 23, 2020

(54) CONTEXT DETERMINATION FOR PLANAR MODE IN OCTREE-BASED POINT CLOUD CODING

(71) Applicants: BlackBerry Limited, Waterloo (CA); 2236008 Ontario Inc., Waterloo OT (CA)

(72) Inventors: Sébastien Lasserre, Thorigne-Fouillard (FR); David Flynn, Darmstadt (DE)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

(21) Appl. No.: 16/456,150

(22) Filed: Jun. 28, 2019

(51) Int. Cl.
  *H03M 7/30* (2006.01)
  *H04L 29/06* (2006.01)
  *G06T 9/00* (2006.01)

(52) U.S. Cl.
  CPC ....... *H03M 7/3079* (2013.01); *H03M 7/6005* (2013.01); *H03M 7/6011* (2013.01); *H04L 65/601* (2013.01); *H04L 65/607* (2013.01); *H04L 65/80* (2013.01); *G06T 9/00* (2013.01)

(58) Field of Classification Search
  CPC ............. H03M 7/3079; H03M 7/6005; H03M 7/6011; H04L 65/601; H04L 65/80; H04L 65/607

USPC ..................................................... 341/51–75
See application file for complete search history.

(56) References Cited

U.S. PATENT DOCUMENTS

| | | | |
|---|---|---|---|
| 2017/0347100 A1* | 11/2017 | Chou | G06T 9/001 |
| 2017/0347120 A1* | 11/2017 | Chou | H04N 19/15 |
| 2017/0347122 A1* | 11/2017 | Chou | H04N 19/60 |
| 2020/0043220 A1* | 2/2020 | Mishaev | G06T 5/002 |
| 2020/0045288 A1* | 2/2020 | Boyce | H04N 13/139 |
| 2020/0045343 A1* | 2/2020 | Boyce | H04N 21/21805 |
| 2020/0045344 A1* | 2/2020 | Boyce | H04N 21/21805 |

* cited by examiner

*Primary Examiner* — Lam T Mai
(74) *Attorney, Agent, or Firm* — Rowand LLP

(57) ABSTRACT

Method and devices for coding point cloud data using a planar coding mode. The planar coding mode may be signaled using in a planar mode flag to signal that a volume is planar. A planar volume has all of its occupied child nodes on one side of a plane bisecting the volume. A planar position flag may signal which side of the volume is occupied. Entropy coding may be used to code the planar mode flag and/or the planar position flag. Context determination for coding may take into account one or more of whether a parent volume containing the volume is planar in occupancy, occupancy of a neighbouring volume at a parent depth, distance between the volume and a closest already-coded occupied volume at a same depth as the volume, plane position, if any, of the closest already-coded occupied volume, and a position of the volume within the parent volume.

20 Claims, 10 Drawing Sheets

US 10,693,492 B1

CONTEXT DETERMINATION FOR PLANAR MODE IN OCTREE-BASED POINT CLOUD CODING

FIELD

The present application generally relates to point cloud compression and, in particular to methods and devices for improved compression of occupancy data in octree-based coding of point clouds.

BACKGROUND

Data compression is used in communications and computer networking to store, transmit, and reproduce information efficiently. There is an increasing interest in representations of three-dimensional objects or spaces, which can involve large datasets and for which efficient and effective compression would be highly useful and valued. In some cases, three-dimensional objects or spaces may be represented using a point cloud, which is a set of points each having a three coordinate location (X, Y, Z) and, in some cases, other attributes like colour data (e.g. luminance and chrominance), transparency, reflectance, normal vector, etc. Point clouds can be static (a stationary object or a snapshot of an environment/object at a single point in time) or dynamic (a time-ordered sequence of point clouds).

Example applications for point clouds include topography and mapping applications. Autonomous vehicle and other machine-vision applications may rely on point cloud sensor data in the form of 3D scans of an environment, such as from a LiDAR scanner. Virtual reality simulations may rely on point clouds.

It will be appreciated that point clouds can involve large quantities of data and compressing (encoding and decoding) that data quickly and accurately is of significant interest. Accordingly, it would be advantageous to provide for methods and devices that more efficiently and/or effectively compress data for point clouds. Such methods may result in savings in storage requirements (memory) through improved compression, or savings in bandwidth for transmission of compressed data, thereby resulting in improved operation of 3D vision systems, such as for automotive applications, or improved speed of operation and rendering of virtual reality systems, as examples.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
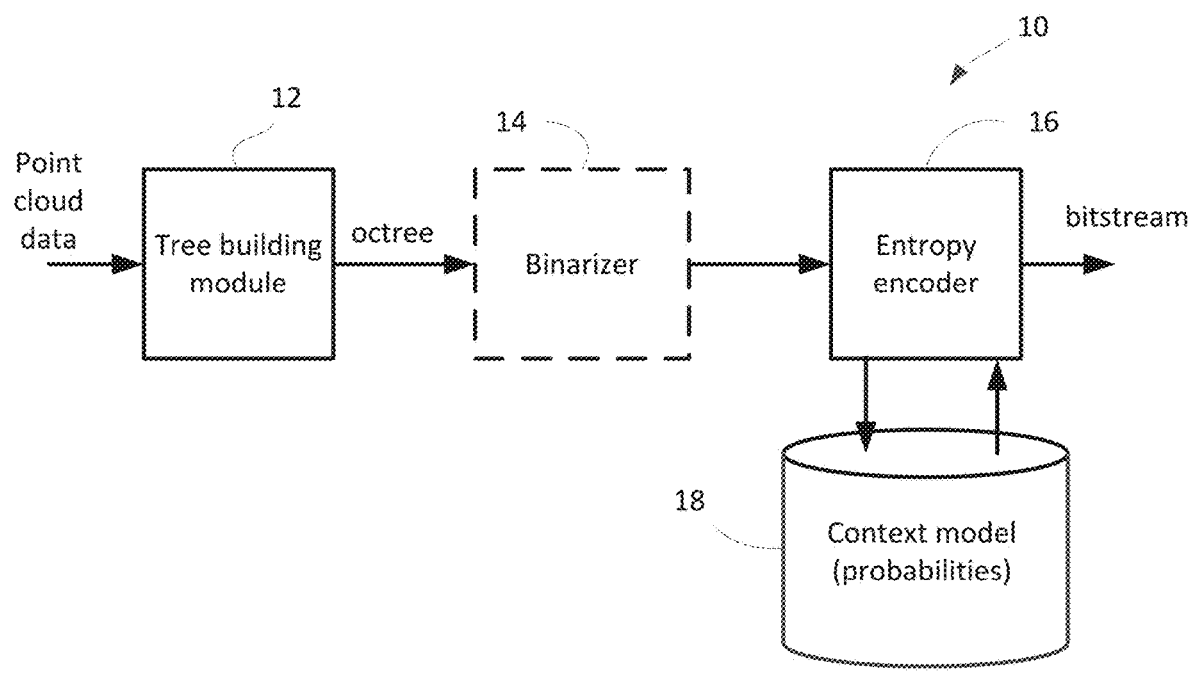
FIG. 1 shows a simplified block diagram of an example point cloud encoder.

The present application describes methods of encoding and decoding point clouds, and encoders and decoders for encoding and decoding point clouds.

In one aspect, the present application describes a method of encoding a point cloud to generate a bitstream of compressed point cloud data representing a three-dimensional location of an object, the point cloud being located within a volumetric space recursively split into sub-volumes and containing points of the point cloud, wherein a volume is partitioned into a first set of child sub-volumes and a second set of child sub-volumes, the first set of child sub-volumes being positioned in a first plane and the second set of child sub-volumes being positioned in a second plane parallel to the first plane, and wherein an occupancy bit associated with each respective child sub-volume indicates whether that respective child sub-volume contains at least one of the points. The method may include determining whether the volume is planar based on whether all child sub-volumes containing at least one point are positioned in either the first set or the second set; encoding in the bitstream a planar mode flag to signal whether the volume is planar; encoding in the bitstream occupancy bits for the child sub-volumes of the first set including, for at least one occupancy bit, inferring its value and not encoding it in the bitstream based on whether the volume is planar; and outputting the bitstream of compressed point cloud data.

In another aspect, the present application describes a method of decoding a bitstream of compressed point cloud data to produce a reconstructed point cloud representing a three-dimensional location of a physical object, the point cloud being located within a volumetric space recursively split into sub-volumes and containing points of the point cloud, wherein a volume is partitioned into a first set of child sub-volumes and a second set of child sub-volumes, the first set of child sub-volumes being positioned in a first plane and the second set of child sub-volumes being positioned in a second plane parallel to the first plane, and wherein an occupancy bit associated with each respective child sub-volume indicates whether that respective child sub-volume contains at least one of the points. The method may include reconstructing the points of the point cloud by reconstructing the occupancy bits by decoding from the bitstream a planar mode flag that indicates whether the volume is planar, wherein the volume is planar if all child sub-volumes containing at least one point are positioned in either the first set or the second set; and decoding from the bitstream occupancy bits for the child sub-volumes of the first set including, for at least one occupancy bit, inferring its value and not decoding it from the bitstream based on whether the volume is planar.

In some implementations, determining whether the volume is planar may include determining that the volume is planar by determining that at least one of the child sub-volumes in the first set contains at least one of the points and that none of the child sub-volumes in the second set contain any of the points, and the method may further include, based on the volume being planar, encoding a planar position flag to signal that said at least one of the child sub-volumes is in the first plane. In such implementations, in some cases encoding occupancy bits includes refraining from coding occupancy bits associated with the second set and inferring values for the occupancy bits associated with the second set based on the second set containing no points. Encoding occupancy bits may further include inferring a last one of the occupancy bits associated with the first set in coding order to have a value indicating occupied based on determining that all other occupancy bits of the first set in the coding order have a value indicating unoccupied.

In some implementations, determining whether the volume is planar includes determining that the volume is not planar and, on that basis, encoding occupancy bits based on at least one of the occupancy bits in the first set and at least one of the occupancy bits in the second set having a value indicating occupied.

In some implementations, the point cloud is defined with respect to a Cartesian axis in the volumetric space, the Cartesian axis having a vertically-oriented z-axis normal to a horizontal plane, and the first plane and the second plane are parallel to the horizontal plane. In some other implementations, the first plane and the second plane are orthogonal to the horizontal plane.

In some implementations, the method includes first determining that the volume is eligible for planar mode coding. Determining that the volume is eligible for planar mode coding may include determining a probability of planarity and determining that the probability of planarity is greater than a threshold eligibility value.

In some implementations, encoding the planar mode flag may include encoding a horizontal planar mode flag and encoding a vertical planar mode flag.

In yet another aspect, the present application describes a method of encoding a point cloud to generate a bitstream of compressed point cloud data representing a three-dimensional location of an object, the point cloud being located within a volumetric space recursively split into sub-volumes and containing points of the point cloud, wherein a volume is partitioned into a first set of child sub-volumes and a second set of child sub-volumes, the first set of child sub-volumes being positioned in a first plane and the second set of child sub-volumes being positioned in a second plane parallel to the first plane, and wherein an occupancy bit associated with each respective child sub-volume indicates whether that respective child sub-volume contains at least one of the points, both the first plane and the second plane being orthogonal to an axis. The method may include determining whether the volume is planar based on whether all child sub-volumes containing at least one point are positioned in either the first set or the second set; entropy encoding in the bitstream a planar mode flag to signal whether the volume is planar, wherein entropy encoding includes determining a context for coding the planar mode flag based, in part, on one or more of: (a) whether a parent volume containing the volume is planar in occupancy, (b) occupancy of a neighbouring volume at a parent depth, the neighbouring volume being adjacent the volume and having a face in common with the parent volume, or (c) a distance between the volume and a closest already-coded occupied volume at a same depth as the volume and having a same position on the axis as the volume; encoding occupancy bits for at least some of the child sub-volumes; and outputting the bitstream of compressed point cloud data.

In a further aspect, the present application describes a method of decoding a bitstream of compressed point cloud data to produce a reconstructed point cloud representing a three-dimensional location of a physical object, the point cloud being located within a volumetric space recursively split into sub-volumes and containing points of the point cloud, wherein a volume is partitioned into a first set of child sub-volumes and a second set of child sub-volumes, the first set of child sub-volumes being positioned in a first plane and the second set of child sub-volumes being positioned in a second plane parallel to the first plane, and wherein an occupancy bit associated with each respective child sub-volume indicates whether that respective child sub-volume contains at least one of the points, both the first plane and the second plane being orthogonal to an axis. The method may include reconstructing the points of the point cloud by reconstructing the occupancy bits by entropy decoding from the bitstream a planar mode flag that indicates whether the volume is planar, wherein the volume is planar if all child sub-volumes containing at least one point are positioned in either the first set or the second set, wherein entropy decoding includes determining a context for decoding the planar mode flag based, in part, on one or more of: (a) whether a parent volume containing the volume is planar in occupancy, (b) occupancy of a neighbouring volume at a parent depth, the neighbouring volume being adjacent the volume and having a face in common with the parent volume, or (c) a distance between the volume and a closest already-coded occupied volume at a same depth as the volume and having a same position on the axis as the volume; and reconstructing occupancy bits for the child sub-volumes.

In some implementations, the parent volume containing the volume is planar in occupancy if a parent planar mode flag indicates that the parent volume is planar.

In some implementations, the distance is near or far and may be based on calculating a distance metric and comparing it to a threshold.

In some implementations, determining the context for coding the planar mode flag may be based on a combination of (a), (b) and (c).

In some implementations, determining whether the volume is planar includes determining that the volume is planar and, as a result, entropy encoding a plane position flag to signal whether the at least one point is positioned in the first set or the second set. Entropy encoding the plane position flag may include determining a context for coding the plane position flag. Determining a context may be based, in part, on one or more of: (a') occupancy of the neighbouring volume at the parent depth; (b') the distance between the volume and the closest already-coded occupied volume; (c') a plane position, if any, of the closest already-coded occupied volume; or (d') a position of the volume within the parent volume. In some cases, determining the context for coding the plane position flag may be based on a combination of three or more of (a'), (b'), (c'), and (d').

In some implementations, the distance is near, not too far, or far and may be based on calculating a distance metric and comparing it to a first threshold and a second threshold.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

Other aspects and features of the present application will be understood by those of ordinary skill in the art from a review of the following description of examples in conjunction with the accompanying figures.

Any feature described in relation to one aspect or embodiment of the invention may also be used in respect of one or more other aspects/embodiments. These and other aspects of the present invention will be apparent from, and elucidated with reference to, the embodiments described herein.

At times in the description below, the terms "node", "volume" and "sub-volume" may be used interchangeably. It will be appreciated that a node is associated with a volume or sub-volume. The node is a particular point on the tree that may be an internal node or a leaf node. The volume or sub-volume is the bounded physical space that the node represents. The term "volume" may, in some cases, be used to refer to the largest bounded space defined for containing the point cloud. A volume may be recursively divided into sub-volumes for the purpose of building out a tree-structure of interconnected nodes for coding the point cloud data. The tree-like structure of partitioning of volumes into sub-volumes may be referred to as a "parent" and "child" relationship, where the sub-volumes are child nodes or child sub-volumes to the parent node or parent volume. Sub-volumes within the same volume may be referred to as sibling nodes or sibling sub-volumes.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as colour, which may also be a three component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be static point cloud data. The LiDAR-based scanning of an environment for machine-vision purposes may be dynamic in that the point cloud (at least potentially) changes over time, e.g. with each successive scan of a volume. The dynamic point cloud is therefore a time-ordered sequence of point clouds.

Point cloud data may be used in a number of applications, including conservation (scanning of historical or cultural objects), mapping, machine vision (such as autonomous or semi-autonomous cars), and virtual reality systems, to give some examples. Dynamic point cloud data for applications like machine vision can be quite different from static point cloud data like that for conservation purposes. Automotive vision, for example, typically involves relatively small resolution, non-coloured, highly dynamic point clouds obtained through LiDAR (or similar) sensors with a high frequency of capture. The objective of such point clouds is not for human consumption or viewing but rather for machine object detection/classification in a decision process. As an example, typical LiDAR frames contain on the order of tens of thousands of points, whereas high quality virtual reality applications require several millions of points. It may be expected that there will be a demand for higher resolution data over time as computational speed increases and new applications are found.

While point cloud data is useful, a lack of effective and efficient compression, i.e. encoding and decoding processes, may hamper adoption and deployment. A particular challenge in coding point clouds that does not arise in the case of other data compression, like audio or video, is the coding of the geometry of the point cloud. Point clouds tend to be sparsely populated, which makes efficiently coding the location of the points that much more challenging.

One of the more common mechanisms for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on resolution of the tree and/or whether there are any points contained in the sub-volume. A node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

A commonly-used tree structure is an octree. In this structure, the volumes/sub-volumes are all cubes and each split of a sub-volume results in eight further sub-volumes/sub-cubes. Another commonly-used tree structure is a KD-tree, in which a volume (cube or rectangular cuboid) is recursively divided in two by a plane orthogonal to one of the axes. Octrees are a special case of KD-trees, where the volume is divided by three planes, each being orthogonal to one of the three axes. The partitioning of a volume is not necessarily into two sub-volumes (KD-tree) or eight sub-volumes (octree), but could involve other partitions, including division into non-rectangular shapes or involving non-adjacent sub-volumes.

The present application may refer to octrees for ease of explanation and because they are a popular candidate tree structure for automotive applications, but it will be understood that the methods and devices described herein may be implemented using other tree structures.

Reference is now made to FIG. 1, which shows a simplified block diagram of a point cloud encoder 10 in accordance with aspects of the present application. The point cloud encoder 10 includes a tree building module 12 for receiving point cloud data and producing a tree (in this example, an octree) representing the geometry of the volumetric space containing the point cloud and indicating the location or position of points from the point cloud in that geometry.

In the case of a uniformly partitioned tree structure, like an octree, each node may be represented by a sequence of occupancy bits, where each occupancy bit corresponds to one of the sub-volumes in the node and signals whether than sub-volume contains at least one point or not. Occupied sub-volumes are recursively split up to a maximum depth of the tree. This may be termed the serialization or binarization of the tree. As shown in FIG. 1, in this example, the point cloud encoder 10 includes a binarizer 14 for binarizing the octree to produce a bitstream of binarized data representing the tree.

This sequence of bits may then be encoded using an entropy encoder 16 to produce a compressed bitstream. The entropy encoder 16 may encode the sequence of bits using a context model 18 that specifies probabilities for coding bits based on a context determination by the entropy encoder 16. The context model 18 may be adaptively updated after coding of each bit or defined set of bits. The entropy encoder 16 may, in some cases, be a binary arithmetic encoder. The binary arithmetic encoder may, in some implementations, employ context-adaptive binary arithmetic coding (CABAC). In some implementations, coders other than arithmetic coders may be used.

In some cases, the entropy encoder 16 may not be a binary coder, but instead may operate on non-binary data. The output octree data from the tree building module 12 may not be evaluated in binary form but instead may be encoded as non-binary data. For example, in the case of an octree, the eight flags within a sub-volume (e.g. occupancy flags) in their scan order may be considered a $2^8-1$ bit number (e.g. an integer having a value between 1 and 255 since the value 0 is not possible for a split sub-volume, i.e. it would not have been split if it was entirely unoccupied). This number may be encoded by the entropy encoder using a multi-symbol arithmetic coder in some implementations. Within a sub-volume, e.g. a cube, the sequence of flags that defines this integer may be termed a "pattern".

A convention that is typically used in point cloud compression is that an occupancy bit value of 1 signals that the associated node or volume is "occupied", i.e. that it contains at least one point, and an occupancy bit value of 0 signals that the associated node or volume is "unoccupied", i.e. that it contains no points. More generally, an occupancy bit may have a value indicating occupied or a value indicating unoccupied. In the description below for ease of explanation, example embodiments may be described in which the convention of 1=occupied and 0=unoccupied is used; however it will be understood that the present application is not limited to this convention.

Figure 2:
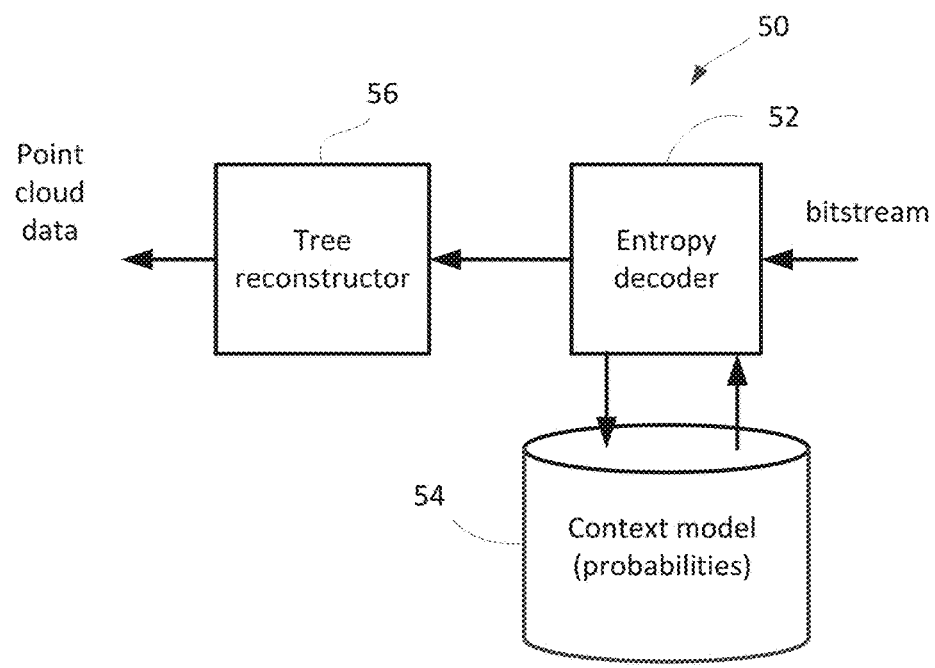
FIG. 2 shows a simplified block diagram of an example point cloud decoder.

A block diagram of an example point cloud decoder 50 that corresponds to the encoder 10 is shown in FIG. 2. The point cloud decoder 50 includes an entropy decoder 52 using the same context model 54 used by the encoder 10. The entropy decoder 52 receives the input bitstream of compressed data and entropy decodes the data to produce an output sequence of decompressed bits. The sequence is then converted into reconstructed point cloud data by a tree reconstructor 56. The tree reconstructor 56 rebuilds the tree structure from the decompressed data and knowledge of the scanning order in which the tree data was binarized. The tree reconstructor 56 is thus able to reconstruct the location of the points from the point cloud (subject to the resolution of the tree coding).

In European patent application no. 18305037.6, the present applicants described methods and devices for selecting among available pattern distributions to be used in coding a particular node's pattern of occupancy based on some occupancy information from previously-coded nodes near the particular node. In one example implementation, the occupancy information is obtained from the pattern of occupancy of the parent to the particular node. In another example implementation, the occupancy information is obtained from one or more nodes neighbouring the particular node. The contents of European patent application no. 18305037.6 are incorporated herein by reference. This is referred to as determining a "neighbour configuration", and selecting a context (i.e. a pattern distribution) at least partly based on the neighbour configuration.

In European patent application no. 18305415.4, the present applicants described methods and devices for binary entropy coding occupancy patterns. The contents of European patent application no. 18305415.4 are incorporated herein by reference.

Certain types of point cloud data tend to have strong directionality. Non-natural environments in particular exhibit strong directionality as those environments tend to feature uniform surfaces. For example, in the case of LiDAR the roadway and the walls of adjacent buildings are generally horizontally or vertically planar. In the case of interior scans within rooms, the floor, ceiling and walls are all planar. LiDAR for the purpose of automotive vision and similar applications tends to be lower resolution and also needs to be compressed quickly and efficiently.

Octrees are efficient tree structures because they are based around a uniform partitioning process of equal division of a cube into eight sub-cubes using three orthogonal planes in every case, so signaling their structure is efficient. However, octrees using current signaling processes are not able to exploit the efficiencies available from recognizing the planar nature of some non-natural environments. KD-trees, however, are able to better tailor the partitioning to the directionality of the point cloud. This makes them a more efficient and effective structure for these types of environments. The downside to KD-trees is that the signaling of their structure requires significantly more data than octrees. The fact that KD-trees are non-uniform means that some of the techniques used to improve octree compression are unavailable to KD-trees or would be computationally difficult to implement.

Accordingly, it would be advantageous to have a mechanism for representing non-natural environments using a uniform partitioning-based tree structure in a manner that improves compression by exploiting horizontal and/or vertical directionality.

In accordance with one aspect of the present application, improved point cloud compression processes and devices feature a planar coding mode. The planar mode is signaled to indicate that a volume meets certain requirements for planarity in terms of its occupancy. In particular, a volume is planar if all of its occupied sub-volumes are positioned or located in a common plane. The syntax for signaling may indicate whether a volume is planar and, if so, the position of the common plane. Through exploiting this knowledge of planarity, gains in compression may be achieved. Applying criteria for eligibility to enable the planar mode and mechanisms for context-adaptive coding of the planar mode signaling help improve compression performance.

In the description below, planarity is presumed to be with respect to a Cartesian axis aligned with the structure of the volumes and sub-volumes. That is a volume is planar if all its occupied sub-volumes are positioned in a common plane orthogonal to one of the axes. As a convention, the axes will presume that the z-axis is vertical, meaning that the (horizontal) plane is orthogonal to the z-axis. In many of the examples below, horizontal planarity will be used to illustrate concepts; however, it will be appreciated that the present application is not limited to horizontal planarity and may alternatively or additionally include vertical planarity with respect to the x-axis, the y-axis, or both the x and y axes. Moreover, in some examples, planarity not necessarily be aligned by orthogonality with the Cartesian axes. To illustrate, in one example, a diagonal vertical planarity may be defined that is at a 45 degree angle with both the x and y axes.

Figure 3:
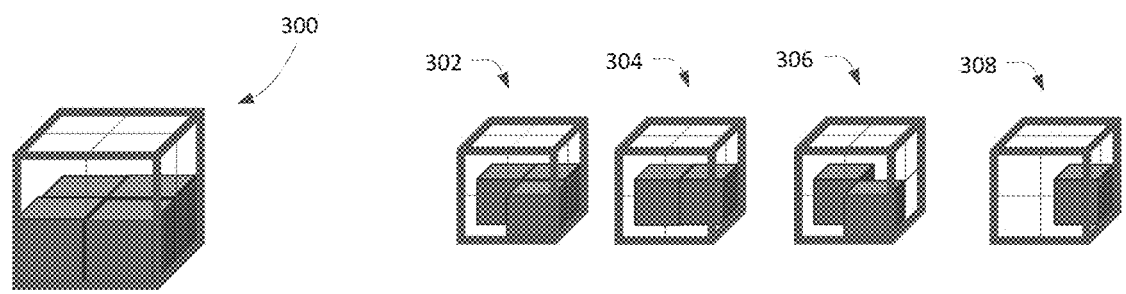
FIGS. 3 and 4 illustrate examples of a volume exhibiting planarity in its occupied child sub-volumes.
Figure 4:
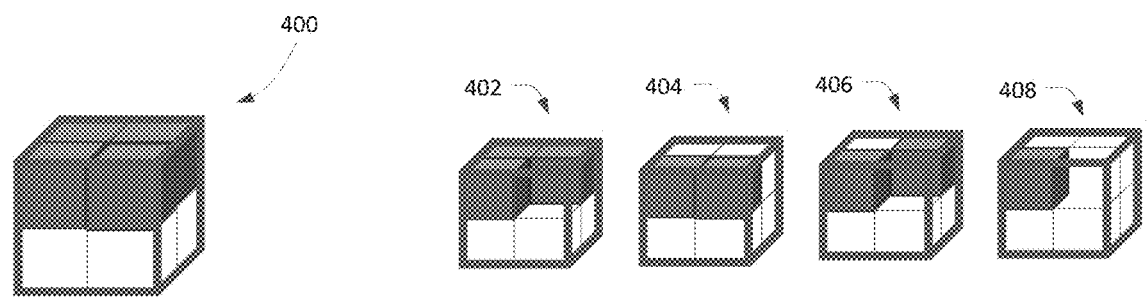

Reference is now made to FIGS. 3 and 4, each of which show example volumes 300 and 400. In this example, horizontal planarity will be illustrated and discussed, but those ordinarily skilled in the art will appreciated the extension of the concepts to vertical or other planarity.

Volume 300 is shown partitioned in to eight sub-volumes. Occupied sub-volumes are indicated using shading, whereas unoccupied sub-volumes are shown empty. It will be noted that the lower (in a z-axis or vertical sense) four sub-volumes in the volume 300 are occupied. This pattern of occupancy is horizontally planar; that is, each of the occupied sub-volumes is in the same horizontal plane, i.e. has the same z-position. Volume 400 shows another example of a horizontally planar pattern of occupancy. All the occupied sub-volumes of volume 400 are in the same horizontal plane. Volume 300 shows a case in which the lower plane is occupied. Volume 400 shows a case in which the upper plane is occupied. This may be termed the "plane position", where the plane position signals where the planar sub-volumes are within the volume. In this case, it is a binary 'upper' or 'lower' signal.

Planarity of a volume is not limited to the case in which all sub-volumes of a plane, e.g. all sub-volumes of the upper half of a 2×2×2 volume, are occupied. In some cases, only some of the sub-volumes in that plane are occupied, provided there are no occupied sub-volumes outside of that plane. In fact, as few as one occupied sub-volume may be considered "planar". Volumes 302, 304, 306, 308, 402, 404, 406, and 408 each illustrate examples of horizontally planar occupancy. Note with respect to volumes 308 and 408 that they meet the requirements for being horizontally planar since in each case the upper or lower half of the volume 308 and 408 is empty, i.e. all occupied sub-volumes (in these examples, one sub-volume) are located in one horizontal half of the volume 308 and 408. It will also be appreciated that in these examples, a volume with a single occupied sub-volume would also meet the requirements for vertical planarity with respect to the y-axis and vertical planarity with respect to the x-axis. That is, the volumes 308 and 408 are planar in three directions.

Planarity may be signaled with respect to a volume through a planar mode flag, e.g. isPlanar. In the case where there are multiple planar modes possible, e.g. with respect to the z-axis, y-axis, and x-axis, there may be multiple flags: isZPlanar, isYPlanar, isXPlanar. In this example, for ease of illustration, it is presumed that only horizontal planar mode is enabled.

The planar mode flag indicates whether a volume is planar or not. If it is planar, then a second syntax element, a plane position flag, planePosition, may be used to signal the position of the plane within the volume. In this example, the planePosition flag signals whether the planar occupied sub-volumes are in the upper half or lower half of the volume.

In a more complex implementation involving non-orthogonal planes, e.g. planes that are diagonal with respect to one or more of the axes, a more complex signaling syntax may be used involving multiple flags or a non-binary syntax element.

The planar mode flag and/or the plane position flag may be encoded in the bitstream using any suitable coding scheme. The flags may be entropy encoded in some implementations using prediction and/or context-adaptive coding to improve compression. Example techniques for determining context for coding the flags are discussed further below.

Occupancy Coding and Planar Mode

By signaling planarity, the coding of occupancy bits may be altered, since the planarity information allows for inferences to be made about the occupancy pattern that shortcut the signaling of occupancy. For example, if a volume is planar, then the four sub-volumes not pointed at by the plane position flag may be presumed empty and their occupancy bits need not be coded. Only the up-to-four bits of the occupied plane need be coded. Moreover, if the first three coded bits of that plane are zero (unoccupied), then the last (fourth) bit in the coding order may be inferred to be one (occupied) since the planar signaling indicated that the plane was occupied. Additionally, if planar signaling indicates that a volume is not planar, then there must be at least one occupied sub-volume in both planes, which allows for additional inferred occupancy of the last bits of either plane if the first three occupancy bits of either plane are zero.

Accordingly, signaling planar mode may provide efficiencies in coding of occupancy data. Nevertheless, planar mode signaling adds syntax elements to the bitstream and may not provide efficiencies in all situations. For example, in a dense point cloud and at certain depths signaling planarity may not be advantageous since any node with more than five occupied child nodes cannot be planar by definition. Therefore, it may be further advantageous to have eligibility criteria for enabling planar mode. It would be further advantageous to provide for eligibility criteria that adapt to the local data.

In one example, eligibility may be biased towards use with sparse clouds. For example, the eligibility criteria may be a based on a metric such as the mean number of occupied child nodes in a volume. This running mean may be determined for a certain depth of the tree and then used for eligibility of planar mode at the next lower depth. In one example, planar mode may be disabled if the mean number of occupied sub-volumes is greater than 3. This technique has the advantage of being simple, but lacks adaptation to local properties of the cloud.

In another example, a running probability factor may be determined. The probability factor may indicate the likelihood of a node being planar, i.e. a probability of planarity. If the probability is low, it indicates that the cost of signaling planarity will be high for little potential gain. A threshold eligibility value may be set and planar mode may be enabled for a given volume/node if the then-current probability factor is greater than the threshold:

$$p=\text{prob}(\text{planar}) \geq \text{threshold}$$

As an example, the threshold selected may be 0.6; however, it will be appreciated that other values may be used for other situations. The probability is updated during the coding process. The update process may be tuned for fast or slow updates for particular applications. A faster update may give greater weight or bias towards the most recently-coded nodes.

An example probability update process may be expressed as:

$$p_{new}=(Lp+\delta(\text{coded node}))/(L+1)$$

In the above expression, p is the current probability, $p_{new}$ is the updated probability, $\delta(\text{coded node})$ is planar status of the current node, which is 0 for non-planar and 1 for planar, and L is a weighting factor for tuning how quickly the update occurs. The weighting factor L may be set to a power of two minus one, such as 255, to allow for simple integer implementation; more particularly, the division may be implemented using a straightforward shift operation. Note that planar status does not necessarily mean that a planar mode flag was encoded, so that the probability tracks planarity in recent nodes whether or not planar mode was enabled. For example, during the decoding process, the planar status of any node is known after the decoding of the occupancy bits associated with the node independently of whether a planar mode flag was decoded or not.

The update of probability may occur when node occupancy is encoded or decoded, for example. In another example, the update of probability may occur when node planar information is decoded for a current node. The updated probability is then used to determine eligibility of the next node in the coding order for planar mode signaling.

As noted earlier, planar mode may be signaled for the horizontal plane (z-axis) or vertical planes (x-axis or y-axis), or for any two or all three. In the case where it is possible to signal planar modes for more than one direction, the eligibility criteria may differ. That is, each additional planar mode signaled for a node the benefits in terms of occupancy signaling are half. With the first planar mode, half the occupancy bits may be inferred if planar. With the second planar mode, only two of the remaining four occupancy bits may be inferred, and so on. Accordingly, the threshold for signaling an additional planar mode may be higher than the first planar mode.

The definition of "first", "second" and "third" planar mode may be based on the probabilities and their order from most probably to least probable. The thresholds may then be applied for eligibility with the first threshold being lower than the second threshold, and so on. Example threshold values are 0.6, 0.77, and 0.88, although these are merely illustrative. In another embodiment, there is only one threshold and only the most probable planar mode is enabled even if more than one of the planar modes meets the threshold.

Figure 5:
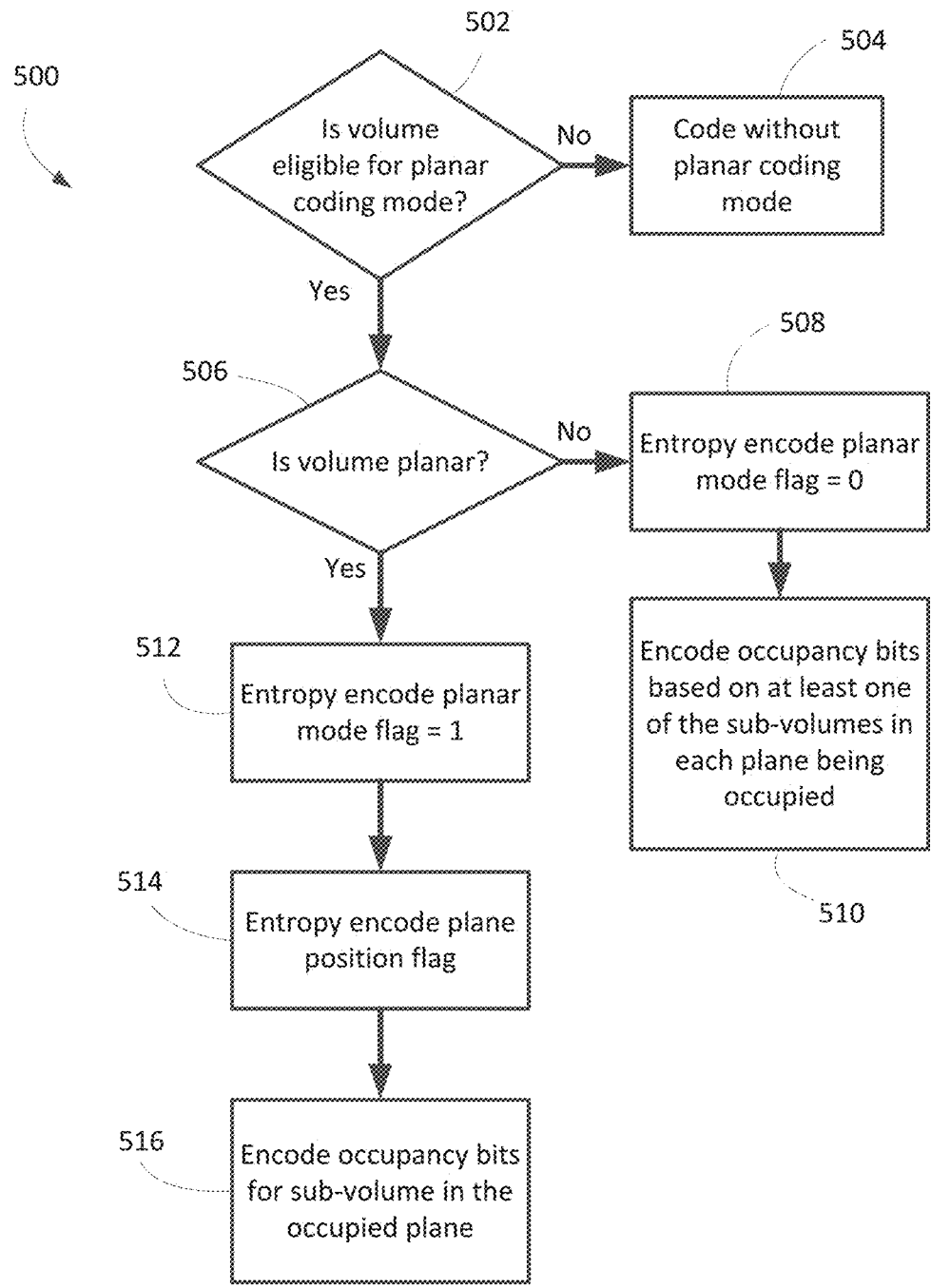
FIG. 5 shows, in flowchart form, one example method of encoding point cloud data using a planar coding mode.

Reference is now made to FIG. 5, which shows, in flowchart form, an example method 500 of encoding point cloud data using a planar mode. The method 500 reflects the process for encoding occupancy information for a volume. In this example, the volume is uniformly partitioned into eight sub-volumes, each having an occupancy bit, in accordance with octree-based coding. For simplicity, the present example assumes only one (e.g. horizontal) planar mode is used.

In operation 502, the encoder assesses whether the volume is eligible for planar coding mode. As discussed above, eligibility may be based on cloud density in one example, which may be assessed using mean number of occupied child nodes. To improve local adaptation, eligibility may be based on probability factor tracking. If planar coding mode is not eligible, then the occupancy pattern for the volume is encoded without using planar coding mode, as indicted by operation 504.

If planar mode is enabled, then in operation 506, the encoder assesses whether the volume is planar. If not, then in operation 508 it encodes the planar mode flag, e.g. isPlanar=0. In operation 510, the encoder then encodes the occupancy pattern based on there being at least one occupied sub-volume per plane. That is, the occupancy pattern is encoded and if the first three bits coded for either plane (upper or lower) are zero then the last (fourth) bit for that plane is not coded and is inferred to be one since the corresponding sub-volume must be occupied.

If planar mode is enabled and the volume is planar, then in operation 512 the planar mode flag is encoded, e.g. isPlanar=1. Because the volume is planar, the encoder then also encodes the plane position flag, planePosition. The plane position flag signals whether the planar occupied sub-volumes are in the upper half or lower half of the volume. For example, planePosition=0 may correspond to the lower half (i.e. lower z-axis position) and planePosition=1 may correspond to the upper half. The occupancy bits are then encoded based on knowledge of the planarity of the volume and the position of the occupied sub-volumes. That is, up to four bits are encoded since four may be inferred to be zero, and the fourth bit may be inferred to be one if the first three encoded are zero.

Figure 6:
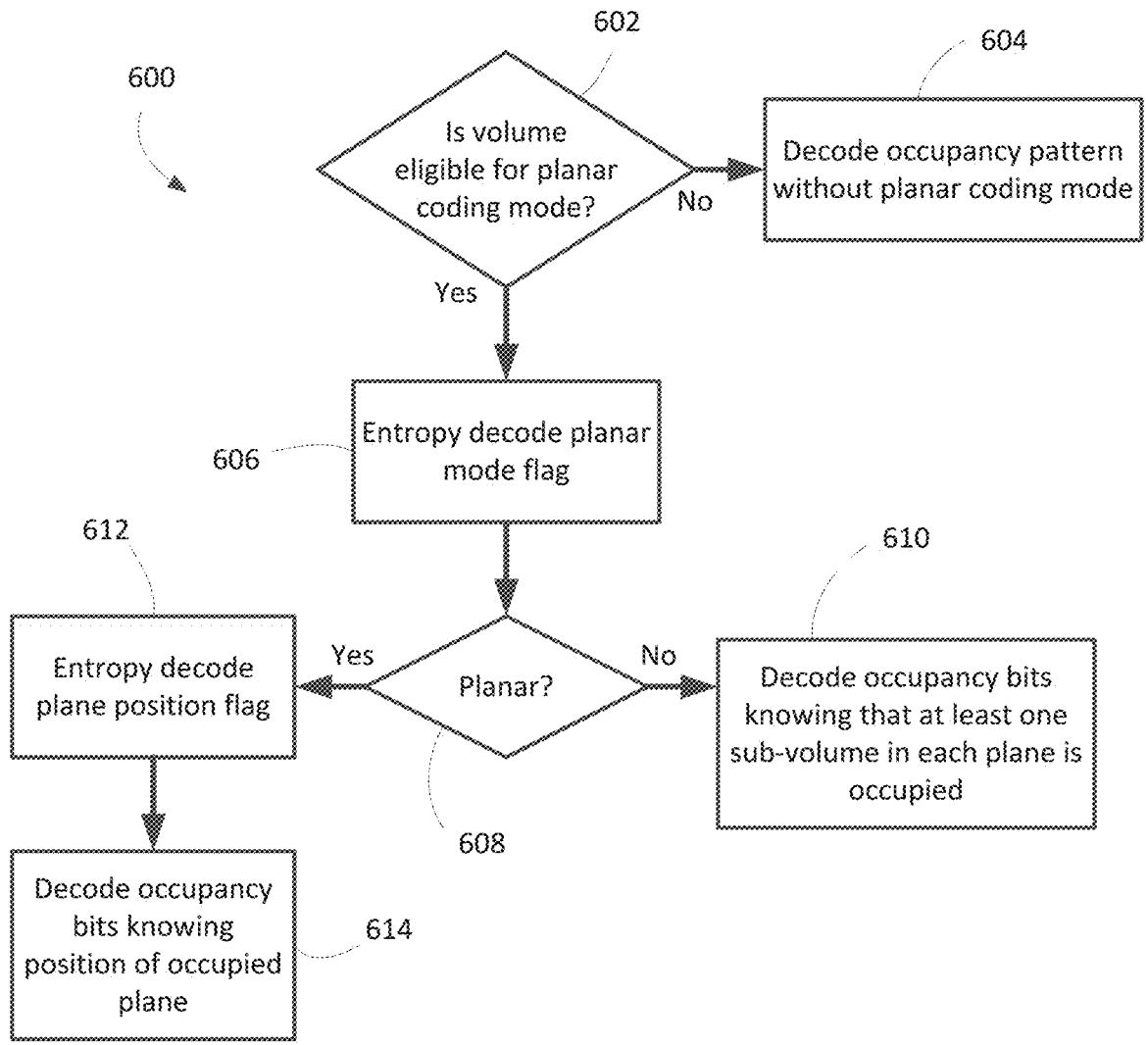
FIG. 6 shows, in flowchart form, one example method of decoding point cloud data using a planar coding mode.

An example method 600 of decoding encoded point cloud data is shown in FIG. 6. The example method 600 is implemented by a decoder that receives a bitstream of encoded data. For a current volume, the decoder determines whether the volume is eligible for planar mode in operation 602. The eligibility assessment is the same assessment as was carried out at the encoder. If not eligible, then the decoder entropy decoder the occupancy pattern as per usual without using planar mode signaling, as indicated by operation 604.

If planar mode is enabled, then in operation 606 the decoder decodes the planar mode flag. The decoded planar mode flag indicates whether the volume is planar or not, as indicated by operation 608. If not planar, then the decoder decodes occupancy bits knowing at least one sub-volume in each plane is occupied. This may allow the decoder to infer one or two of the occupancy bits depending on the value of the other bits decoded.

If the decoded planar mode flag indicates that the volume is planar, then in operation 612 the decoder decodes a plane position flag. The decoded plane position flag indicates whether the occupied sub-volumes are the upper half or lower half of the volume. Based on that knowledge, the decoder then infers the value of the four occupancy bits in the unoccupied half as zero and it decodes the up to four bits of the occupancy pattern for the occupied half, as shown by operation 614.

As noted earlier, the coding of occupancy bits may include entropy coding based, in part, on neighbour configuration, where the neighbour configuration reflects the occupancy of various volumes sharing at least a face with the current volume. In assessing neighbour configuration, if the neighbour configuration (NC) is zero, meaning none of the neighbouring volumes is occupied, then a flag may be coded to signal whether the current volume has a single occupied sub-volume.

Figure 7:
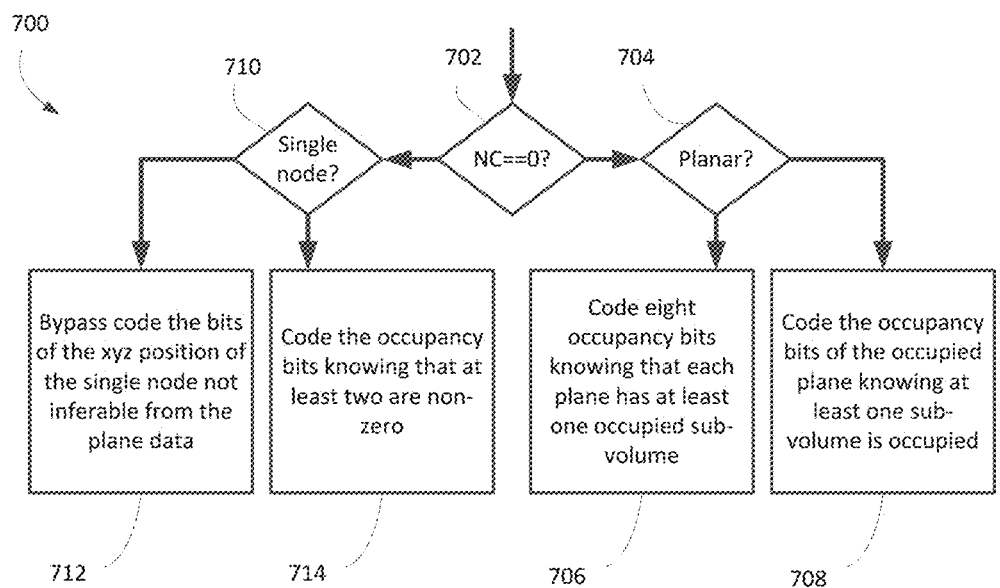
FIG. 7 shows a portion of one example of a process for coding occupancy bits based on planarity information.

The coding of occupancy bits using NC and single node signaling may be adapted based on planar mode signaling as shown in FIG. 7. FIG. 7 shows an example method 700 of occupancy bit coding. The portion of the flowchart showing the method 700 reflects the impact of planar signaling on occupancy bit coding. Although not shown, it may be presumed that suitable eligibility testing occurs and that a planar flag and position flag, if applicable, are encoded/decoded. In this example, it will be presumed that only one planar mode is possible, but extension to other modes or additional modes will be understood.

In operation 702, the coder assesses whether NC is zero, i.e. whether all neighbouring volumes are empty. If not then, the coder assesses whether the volume is planar in operation 704. If not planar, then the coder encodes or decodes the eight occupancy bits knowing that at least one bit in each plane is 1, as shown by operation 706. If planar, then the coder infers the bits of the unoccupied plane to be zero and codes the other four bits knowing that at least one of the occupancy bits is 1.

If NC is zero, then the coder determines whether there is a single occupied sub-volume, which is indicated in the bitstream by a single node flag, as shown in operation 710. If single node is true, then in operation 712 data is bypass coded to signal any remaining x-y-z position data regarding the location of the single node within the volume that is not already available from coded planar mode and plane position flags. For example, if the planar mode is enabled for coding horizontal plane information, then to signal the single node location x and y flags are bypass coded, but the z-location is known from the plane position flag.

If single node is false, then the occupancy bits are coded knowing that at least two sub-volumes are occupied, as indicated by operation 714. This may include determining whether the volume is planar and, if so, its plane position, and then coding the occupancy bits accordingly. For example, if planar then the unoccupied plane may be inferred to contain all zero bits, and the bits of the occupied plane may be coded and up to two of them may be inferred based on the knowledge that at least two sub-volumes are occupied.

Figure 8:
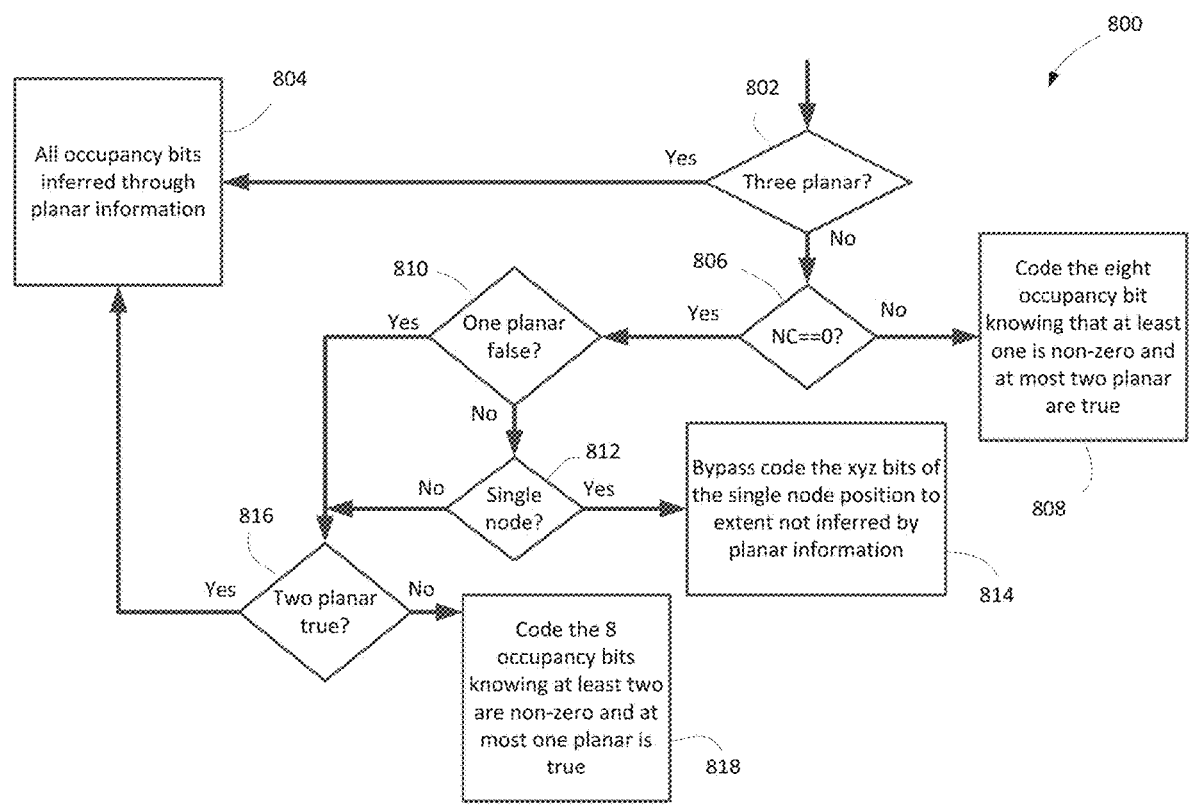
FIG. 8 shows a portion of another example of a process for coding occupancy bits based on planarity information.

Reference is now made to FIG. 8, which shows a flowchart illustrating one example method 800 of coding occupancy bits with three planar modes possible. The portion of the flowchart showing the method 800 reflects the impact of planar signaling on occupancy bit coding. Although not shown, it may be presumed that suitable eligibility testing occurs and that planar flags and position flags, if applicable, are encoded/decoded. The coder first assesses whether all three planar modes indicate that the volume is planar with respect to all three axes, as shown at operation 802. If so, then they collectively indicate the location of the single occupied sub-volume and all occupancy bits may be inferred, as shown by operation 804.

If not all planar, then the coder assesses whether the neighbour configuration is zero in operation 806. If NC is not zero, then the occupancy bits are coded based on planar mode signaling in operation 808. As discussed above, the occupancy bit coding may be masked by planar mode signaling allowing a number possible inferences to be made to short-cut the occupancy coding.

If NC is zero, then a single node flag may be coded. The coder first assesses whether at least one of the planar mode flags indicates that planar mode is false. If so, that would imply that it cannot be a single node situation because more than one sub-volume is occupied. Accordingly, if that is not the case, i.e. no planar is false, in operation 810 then the single node flag is assessed and coded in operation 812. If the single node flag is set, the x, y, z, bits of the single node position may be bypass coded to the extent that they are not already inferred from plane position data, as shown by operation 814.

If operation 810 determines that at least one planar mode flag indicates the volume is non-planar, or if in operation 812 the signal node flag indicates that it is not a single node, then the coder assesses in operation 816 whether there are two planar mode flags that indicate the volume is planar in two directions and, if so, then all occupancy bits may be inferred in operation 804. If not, then the occupancy bits are coded in operation 818 knowing planarity, if any, and that at least two bit are non-zero.

Those ordinarily skilled in the art will appreciate that a feature adopted into current test modes for point cloud coding is Inferred Direct Coding Mode (IDCM), which is for handling very isolated points. Because there is little correlation to exploit with neighbouring nodes, the position of the isolated point is directly coded instead of coding the occupancy information of cascaded single child nodes. This mode is eligible under conditions of isolation of the node and, in case of eligibility, the IDCM activation is signaled by an IDCM flag. In case of activation, the local positions of the point or points belong to the node are coded and the node then becomes a leaf node, effectively halting the recursive partitioning and tree-based coding process for that node.

The present process of signaling planarity may be incorporated into coding processes with an IDCM mode by signaling planarity, if eligible, before signaling IDCM. Firstly, the eligibility of a node for IDCM may be impacted by the planar information. For example, if a node is not planar, the node may not become eligible for IDCM. Secondly, in case of IDCM activation, the planar knowledge helps coding the positions of the points in the volume associated with the node. For example, the following rules may be applied:

if the node is x-planar, the position planeXPosition of the plane is known, thus the highest bit of the x-coordinate of the points is known from the plane position. This bit is not coded in IDCM; the decoder will deduce it from the plane position if the node is y-planar, the position planeYPosition of the plane is known, thus the highest bit of the y-coordinate of the points is known from the plane position. This bit is not coded in IDCM; the decoder will deduce it from the plane position if the node is z-planar, the position planeZPosition of the plane is known, thus the highest bit of the z-coordinate of the points is known from the plane position. This bit is not coded in IDCM; the decoder will deduce it from the plane position The inference of the highest bits of the xyz-coordinates still holds in case the node is planar in several directions. For example, if the node is x-planar and y-planar, the highest bit for both the x-coordinate and the y-coordinate are inferred by planeXPosition and planeYPosition.

Entropy Coding of Planar Mode Syntax

Planar mode syntax, such as the planar mode flag or the plane position flag, may represent a significant portion of the bitstream. Accordingly, to make planar mode effective in compressing point cloud data, it may be advantageous to ensure the planar information is entropy coded with effective context determination.

Recall that whether a node/volume is planar or not is signaled using a planar mode flag, isPlanar. In the present discussion of examples, it will be assumed that the planar mode is applicable for horizontal planarity, i.e. with respect to the z-axis. The flag may be termed isZPlanar in this example. Entropy encoding of the flag may employ a binary arithmetic coder, e.g. a context-adaptive binary arithmetic coder (CABAC). The context (or internal probability) may be determined using one or more predictive factors.

The planar mode flag for a current node or sub-volume signals whether the child sub-volumes within the sub-volume are planar. The current node or sub-volume exists within a parent volume. As examples, the predictive factors for determining context for coding the planar mode flag may include one or more of:

(a) parent volume planarity;
(b) occupancy of adjacent neighbouring volume; and
(c) distance to closest occupied already-coded node at same depth and at same z-axis position.

Figure 9:
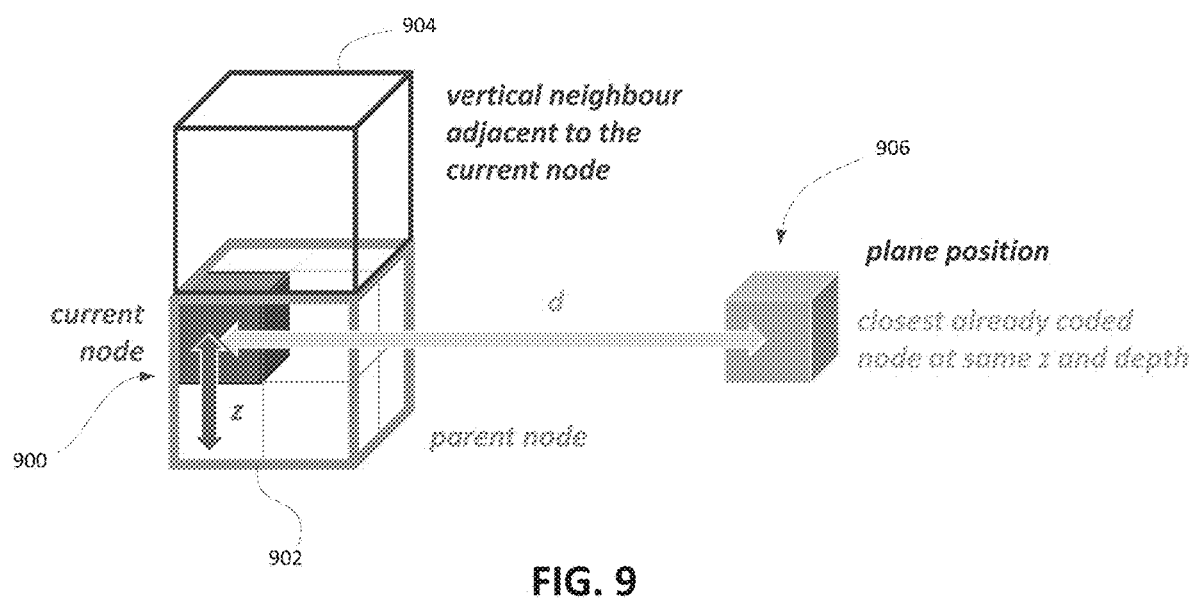
FIG. 9 diagrammatically illustrates possible factors in determining context for coding a planar mode flag or plane position flag.

FIG. 9 illustrates the three example factors with regard to a current node 900 within a parent node 902.

Factor (a) refers to whether the parent node 902 was planar or not. Irrespective of whether it was coded using planar mode, if the parent node 902 meets the criteria for planarity (in this case, horizontal planarity) then the parent node 902 is considered planar. The factor (a) is binary: "parent is planar" or "parent is not planar".

Factor (b) refers to the occupancy status of a neighbouring volume 904 at the parent depth adjacent to a face of the parent volume aligned with the plane. In the case of horizontal planarity, the neighbouring volume 904 is vertically above the parent node 902 if the current node 900 is in the top half of the parent volume 902. If the current node 900 were in the bottom half of the parent node 902, then the neighbouring volume 904 would be vertically below. In the case of vertical planarity, the neighbouring volume would be adjacent to one of the sides, depending on x-axis or y-axis planarity and location of the current node. Factor (b) is also binary: the neighbour is either occupied or not occupied.

Factor (c) refers to how far away a closest already-coded node 906 is under conditions that the already-coded node is located at the same depth as the current node 900 and lies in a common plane, i.e. is at the same z-axis position as the current node 900. The already-coded node 906 is not necessarily in an adjacent volume and could be some distance away, depending on the density of the cloud. The coder tracks already-coded nodes and identifies the closest one that meets these criteria. The distance d, between the current node 900 and an already coded node 906, may be determined from relative positions of the nodes 900 and 906. In some embodiments, an L1 norm may be used to determine distance, i.e. absolute value of delta-x plus absolute value of delta-y, for simplicity of calculation. In some embodiments, an L2 norm may be used to determine the distance, i.e. (the square root of) the sum of squares given by delta-x squared plus delta-y squared.

In some implementations, the distance d may be discretized into two values "near" and "far". The division between a "near" d and a "far" d may be suitably selected. By categorizing distance as either near or far, factor (c) is also binary. It will be appreciated that in some implementations the distance may be discretized into three or more values.

If all three example factors are used in context determination, then 2×2×2=8 separate contexts may be maintained for coding of the planar mode flag.

If the planar mode flag is coded for the current node 900 and the current node 900 is planar, then a plane position flag may be coded, such as planeZPosition. The plane position flag signals which half of current node 900 contains the occupied child sub-volumes. In the case of horizontal planarity, the plane position flag signals either the bottom half or the top half.

Entropy encoding of the plane position flag may also employ a binary arithmetic coder, e.g. CABAC. The context (or internal probability) may be determined using one or more predictive factors, possible examples of which include:

(a') occupancy of adjacent neighbouring volume 904;

(b') distance to closest occupied already-coded node 906 at same depth and at same z-axis position;

(c') if the closest occupied already-coded node 906 at the same depth and z-axis position is planar, its plane position; and (d') location of current node 900 within the parent node 902.

Factor (a') is the same as factor (b) discussed above with regard to planar mode flag context. Factor (b') is the same as factor (c) discussed above with regard to planar mode flag context. In some example implementations, factor (b') may discretize the distance into three categories: "near", "not too far", and "far". As discussed above, distance may be determined using an L1 norm, or an L2 norm, or any other suitable measure.

Factor (c') refers to whether the closest occupied already-coded node 906 is planar or not and, if so, whether it is top or bottom planar, i.e. its plane position. It turns out that even a distant already-coded node that is planar may be a strong predictor of planarity or plane position for a current node. That is, factor (c') may have three outcomes: not planar, same plane position as the current node 900, different plane position from current node 900. If the current node 900 and the closest already-coded occupied node 906 have the same plane position, then their occupied child sub-volumes are all aligned in a common horizontal plane at the same z-axis position.

Factor (d') refers to whether the current node 900 is located in the top half or bottom half of the parent node 902 (in the case of horizontal planarity). Because the parent is likely planar due to eligibility requirements, if the current node 900 is planar, then the plane position is slightly more likely to be at the "outside" of the parent node 902 and not towards the middle. Accordingly, the position of the current node 900 in its parent node 902 has a noticeable impact on the probability of the plane position within that current node 900.

In an implementation combining all four factors, there may be 2×3×2×2=24 predictive combinations in a case where the closest occupied already-coded node 906 at the same z and the depth (as the current node 900) is planar; otherwise, when the closest already-coded node 906 at the same z and the same depth is not planar, a specific context is used instead. Thus, 24+1=25 contexts may be used by the binary arithmetic coder to code the plane position flag in such an example.

Although the above examples refer to three factors for context determination in the case of the planar mode flag and four factors for context determination in the case of the plane position flag, it will be appreciated that the present application includes use of individual factors for context determination and all combinations and sub-combination of such factors.

Figure 10:
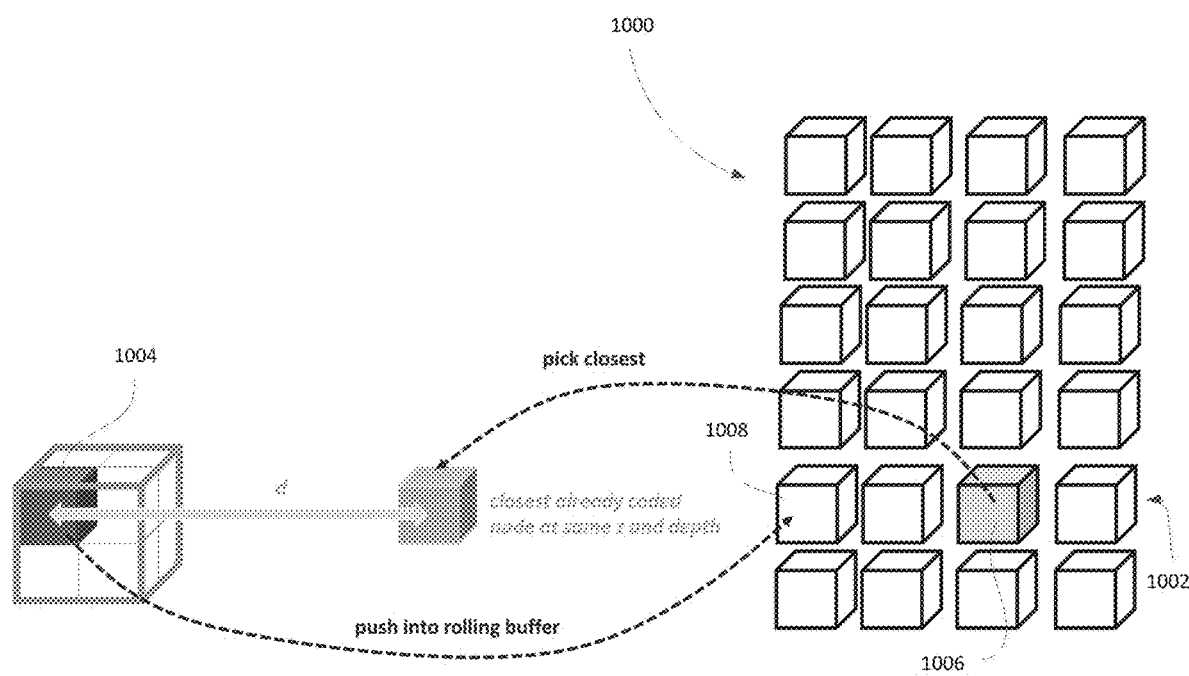
FIG. 10 shows one example mechanisms for tracking a closest already-coded occupied node at the same depth and in a common plane.

Reference is now made to FIG. 10, which diagrammatically illustrates one example implementation of a mechanism for managing the determination of a closest occupied already-coded node during the context determination process. In this example mechanism, the coding device uses a memory, e.g. a volatile or persistent memory unit, to implement a buffer 1000 that contains information regarding occupied already-coded nodes. In particular, the buffer 1000 allocates space to track already-coded nodes having the same z-axis location and depth in the tree. In this specific example, the buffer 1000 tracks information relating to up to four already-coded nodes having the same z-axis position and depth.

Each row of the example buffer 1000 corresponds to a z-axis position and depth. The four columns correspond to four recently-coded occupied nodes having that z-axis position. For example, an example row 1002 contains data regarding four already-coded occupied nodes. The stored data for each already-coded node may include the x and y position of the already-coded occupied node, whether the node was planar and, if so, the plane position.

In the course of coding a current node 1004, a coding device access the buffer 1000 to identify a closest occupied already-coded node from among the four stored nodes in the example row 1002, based on the example row 1002 being for the same z-axis position as the current node 1004. As discussed above, the distance metric may be based on an L1 norm, an L2 norm, or any other measure of distance. The stored x and y positions for each node in the buffer 1000 assist in making the determination of the closest node straightforward, particularly in the case of an L1 norm.

Once the closest node is identifies, such as closest node 1006, its distance from the current node 1004 and perhaps its planarity and/or plane position are used in the context determination(s). The buffer 1000 is then updated by adding the current node 1004 to a first position 1008 of the buffer 1000 and right shifting all the other node data in that example row 1002 of the buffer 1000 causing the last item in the buffer 1000 to be discarded. In some examples, based on the distance determination it may be that the identified closest node retains higher potential relevance to current coding, so prior to adding the current node 1004 to the buffer 1000, the contents of the example row 1002 are first rearranged to as to move the closest node 1006 to the first position 1008 and shifting nodes to the right to accommodate, e.g. in this example the node data in the first position 1008 and a second position are shifted to the second position and third position, respectively. In this manner, the coding device avoids expelling the mostly-recently identified closest node from the buffer 1000 prematurely.

It will be appreciated that the described buffer 1000 is one example implementation of a mechanism for managing data regarding the closest node, but that the present application is not necessarily limited to this example and many other mechanisms for tracking closest node information may be used. Moreover, it will be appreciated that retaining only a fixed number of recently-coded occupied nodes in the buffer 1000 means that there is a chance that the identified node is not actually the closest occupied already-coded node but merely the closest already-coded node available from the buffer 1000; however, even when the buffer is limited to four candidates, as in the example above, the impact on performance is negligible.

Figure 11:
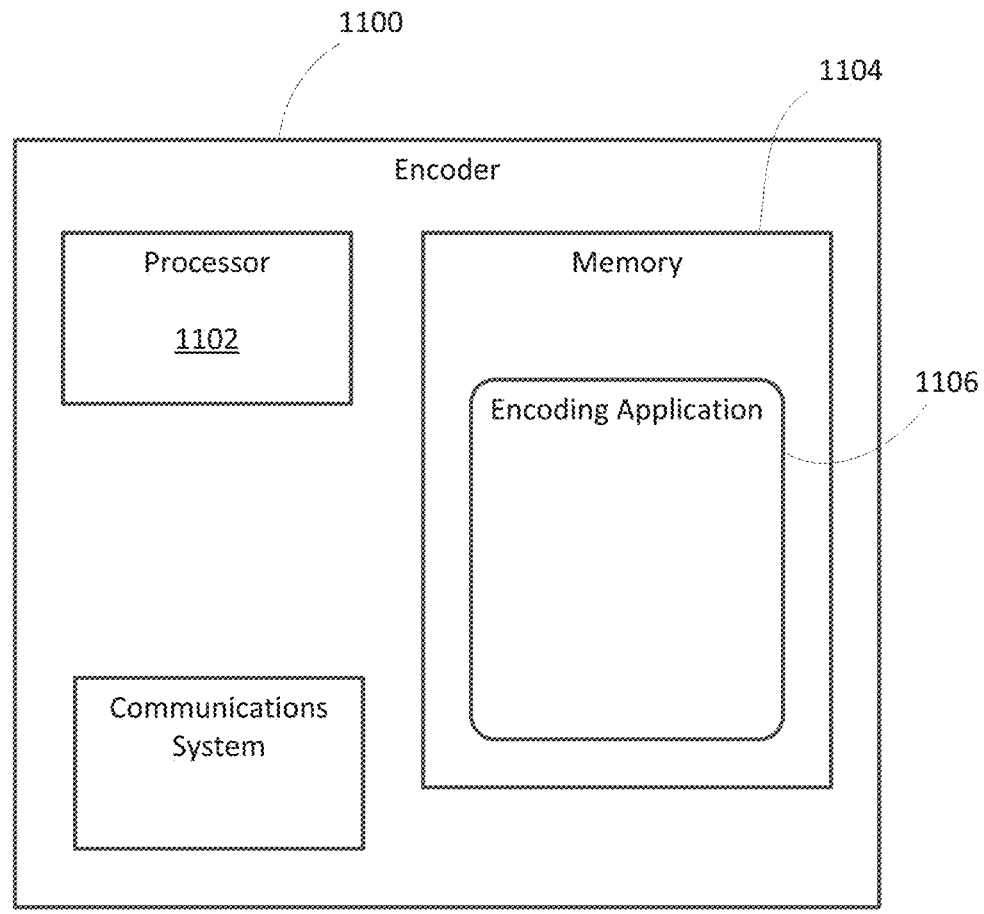
FIG. 11 shows an example simplified block diagram of an encoder.

Reference is now made to FIG. 11, which shows a simplified block diagram of an example embodiment of an encoder 1100. The encoder 1100 includes a processor 1102, memory 1104, and an encoding application 1106. The encoding application 1106 may include a computer program or application stored in memory 1104 and containing instructions that, when executed, cause the processor 1102 to perform operations such as those described herein. For example, the encoding application 1106 may encode and output bitstreams encoded in accordance with the processes described herein. It will be understood that the encoding application 1106 may be stored on a non-transitory computer-readable medium, such as a compact disc, flash memory device, random access memory, hard drive, etc. When the instructions are executed, the processor 1102 carries out the operations and functions specified in the instructions so as to operate as a special-purpose processor that implements the described process(es). Such a processor may be referred to as a "processor circuit" or "processor circuitry" in some examples.

Figure 12:
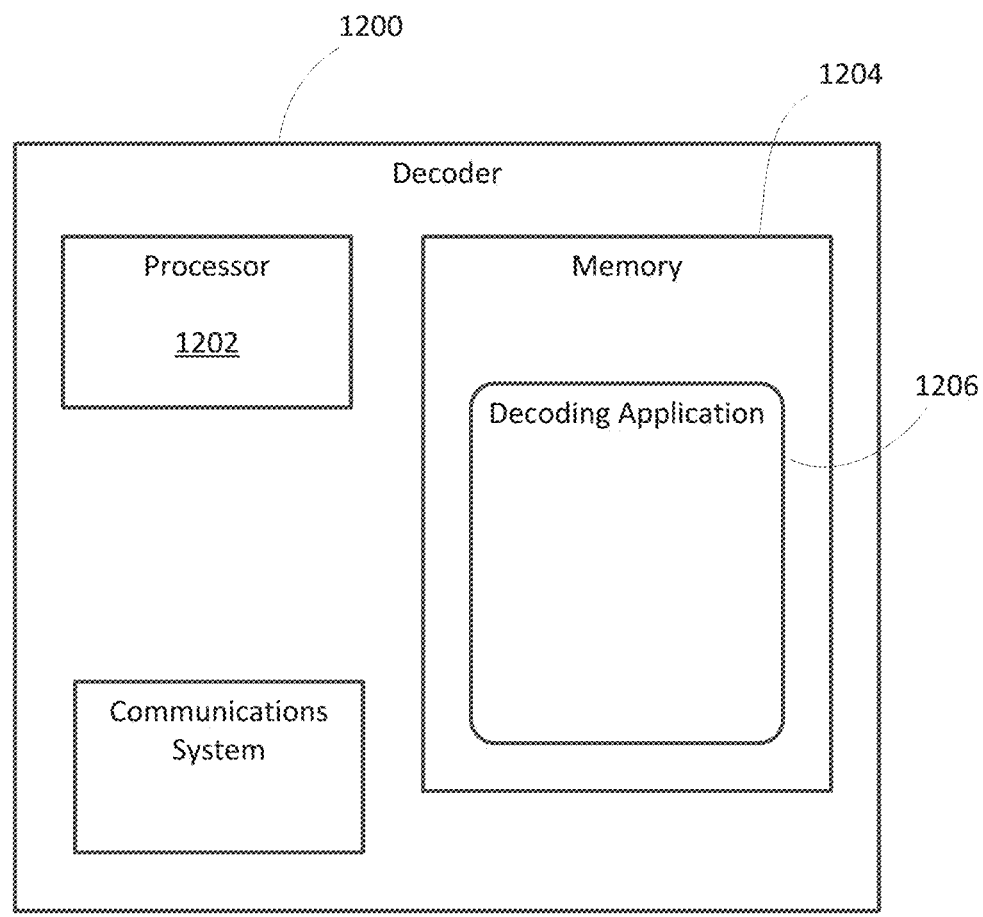
FIG. 12 shows an example simplified block diagram of a decoder.

Reference is now also made to FIG. 12, which shows a simplified block diagram of an example embodiment of a decoder 1200. The decoder 1200 includes a processor 1202, a memory 1204, and a decoding application 1206. The decoding application 1206 may include a computer program or application stored in memory 1204 and containing instructions that, when executed, cause the processor 1202 to perform operations such as those described herein. It will be understood that the decoding application 1206 may be stored on a computer-readable medium, such as a compact disc, flash memory device, random access memory, hard drive, etc. When the instructions are executed, the processor 1202 carries out the operations and functions specified in the instructions so as to operate as a special-purpose processor that implements the described process(es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Impact on Compression Performance

Testing using planar mode in the three dictions x, y and z with an example implementation has been carried out with a number of example point clouds having different characteristics and in comparison with a current implementation of the Motion Picture Experts Group (MPEG) Test Model. The different types of point clouds used in experimentation include those relating to outdoor scenes involving urban building environments, indoor building environments, 3D maps, LiDAR roadway scans, and natural landscapes. Negligible to modest compression gains are seen in the case of natural landscapes. Compression gains of 2 to 4% are seen in the case of 3D maps, up to 10% in the case of outdoor building scenes, 6 to 9% in the case of LiDAR data, and up to more than 50% in the case of some indoor building scenes.

Certain adaptations and modifications of the described embodiments can be made. Therefore, the above discussed embodiments are considered to be illustrative and not restrictive.

What is claimed is:

1. A method of encoding a point cloud to generate a bitstream of compressed point cloud data representing a three-dimensional location of an object, the point cloud being located within a volumetric space recursively split into sub-volumes and containing points of the point cloud, wherein a volume is partitioned into a first set of child sub-volumes and a second set of child sub-volumes, the first set of child sub-volumes being positioned in a first plane and the second set of child sub-volumes being positioned in a second plane parallel to the first plane, and wherein an occupancy bit associated with each respective child sub-volume indicates whether that respective child sub-volume contains at least one of the points, both the first plane and the second plane being orthogonal to an axis, the method comprising:
- determining whether the volume is planar based on whether all child sub-volumes containing at least one point are positioned in either the first set or the second set;
- entropy encoding in the bitstream a planar mode flag to signal whether the volume is planar, wherein entropy encoding includes determining a context for coding the planar mode flag based, in part, on one or more of:
  - (a) whether a parent volume containing the volume is planar in occupancy,
  - (b) occupancy of a neighbouring volume at a parent depth, the neighbouring volume being adjacent the volume and having a face in common with the parent volume, or
  - (c) a distance between the volume and a closest already-coded occupied volume at a same depth as the volume and having a same position on the axis as the volume;
- encoding occupancy bits for at least some of the child sub-volumes; and
- outputting the bitstream of compressed point cloud data.

2. The method claimed in claim 1, wherein the parent volume containing the volume is planar in occupancy if a parent planar mode flag indicates that the parent volume is planar.

3. The method claimed in claim 1, wherein the distance is near or far and is based on calculating a distance metric and comparing it to a threshold.

4. The method claimed in claim 1, wherein determining the context for coding the planar mode flag is based on a combination of (a), (b) and (c).

5. The method claimed in claim 1, wherein determining whether the volume is planar includes determining that the volume is planar and, as a result, entropy encoding a plane position flag to signal whether the at least one point is positioned in the first set or the second set.

6. The method claimed in claim 5, wherein entropy encoding the plane position flag includes determining a context for coding the plane position flag based, in part, on one or more of:
- (a') occupancy of the neighbouring volume at the parent depth;
- (b') the distance between the volume and the closest already-coded occupied volume;
- (c') a plane position, if any, of the closest already-coded occupied volume; or
- (d') a position of the volume within the parent volume.

7. The method claimed in claim 6, wherein the distance is near, not too far, or far and is based on calculating a distance metric and comparing it to a first threshold and a second threshold.

8. The method claimed in claim 6, wherein determining the context for coding the plane position flag is based on a combination of three or more of (a'), (b'), (c'), and (d').

9. A method of decoding a bitstream of compressed point cloud data to produce a reconstructed point cloud representing a three-dimensional location of a physical object, the point cloud being located within a volumetric space recursively split into sub-volumes and containing points of the point cloud, wherein a volume is partitioned into a first set of child sub-volumes and a second set of child sub-volumes, the first set of child sub-volumes being positioned in a first plane and the second set of child sub-volumes being positioned in a second plane parallel to the first plane, and wherein an occupancy bit associated with each respective child sub-volume indicates whether that respective child sub-volume contains at least one of the points, both the first plane and the second plane being orthogonal to an axis, the method comprising:
- reconstructing the points of the point cloud by reconstructing the occupancy bits by
  - entropy decoding from the bitstream a planar mode flag that indicates whether the volume is planar, wherein the volume is planar if all child sub-volumes containing at least one point are positioned in either the first set or the second set, wherein entropy decoding includes determining a context for decoding the planar mode flag based, in part, on one or more of:
    - (a) whether a parent volume containing the volume is planar in occupancy,
    - (b) occupancy of a neighbouring volume at a parent depth, the neighbouring volume being adjacent the volume and having a face in common with the parent volume, or
    - (c) a distance between the volume and a closest already-coded occupied volume at a same depth as the volume and having a same position on the axis as the volume; and
  - reconstructing occupancy bits for the child sub-volumes.

10. The method claimed in claim 9, wherein the parent volume containing the volume is planar in occupancy if a parent planar mode flag indicates that the parent volume is planar.

11. The method claimed in claim 9, wherein the distance is near or far and is based on calculating a distance metric and comparing it to a threshold.

12. The method claimed in claim 9, wherein determining the context for coding the planar mode flag is based on a combination of (a), (b) and (c).

13. The method claimed in claim 9, wherein determining whether the volume is planar includes determining that the volume is planar and, as a result, entropy encoding a plane position flag to signal whether the at least one point is positioned in the first set or the second set.

14. The method claimed in claim 13, wherein entropy encoding the plane position flag includes determining a context for coding the plane position flag based, in part, on one or more of:
- (a') occupancy of the neighbouring volume at the parent depth;
- (b') the distance between the volume and the closest already-coded occupied volume;
- (c') a plane position, if any, of the closest already-coded occupied volume; or
- (d') a position of the volume within the parent volume.

15. The method claimed in claim 14, wherein the distance is near, not too far, or far and is based on calculating a distance metric and comparing it to a first threshold and a second threshold.

16. The method claimed in claim 14, wherein determining the context for coding the plane position flag is based on a combination of three or more of (a'), (b'), (c'), and (d').

17. An encoder for encoding a point cloud to generate a bitstream of compressed point cloud data representing a three-dimensional location of an object, the point cloud being located within a volumetric space recursively split into sub-volumes and containing points of the point cloud, wherein a volume is partitioned into a first set of child sub-volumes and a second set of child sub-volumes, the first set of child sub-volumes being positioned in a first plane and the second set of child sub-volumes being positioned in a second plane parallel to the first plane, and wherein an occupancy bit associated with each respective child sub-volume indicates whether that respective child sub-volume contains at least one of the points, both the first plane and the second plane being orthogonal to an axis, the encoder comprising:
　a processor;
　memory; and
　an encoding application containing instructions executable by the processor that, when executed, cause the processor to:
　　determine whether the volume is planar based on whether all child sub-volumes containing at least one point are positioned in either the first set or the second set;
　　entropy encode in the bitstream a planar mode flag to signal whether the volume is planar, wherein entropy encoding includes determining a context for coding the planar mode flag based, in part, on one or more of:
　　　(a) whether a parent volume containing the volume is planar in occupancy,
　　　(b) occupancy of a neighbouring volume at a parent depth, the neighbouring volume being adjacent the volume and having a face in common with the parent volume, or
　　　(c) a distance between the volume and a closest already-coded occupied volume at a same depth as the volume and having a same position on the axis as the volume;
　　encode occupancy bits for at least some of the child sub-volumes; and
　　output the bitstream of compressed point cloud data.

18. A decoder for decoding a bitstream of compressed point cloud data to produce a reconstructed point cloud representing a three-dimensional location of a physical object, the point cloud being located within a volumetric space recursively split into sub-volumes and containing points of the point cloud, wherein a volume is partitioned into a first set of child sub-volumes and a second set of child sub-volumes, the first set of child sub-volumes being positioned in a first plane and the second set of child sub-volumes being positioned in a second plane parallel to the first plane, and wherein an occupancy bit associated with each respective child sub-volume indicates whether that respective child sub-volume contains at least one of the points, both the first plane and the second plane being orthogonal to an axis, the decoder comprising:
　a processor;
　memory; and
　a decoding application containing instructions executable by the processor that, when executed, cause the processor to reconstruct the points of the point cloud by reconstructing the occupancy bits by:
　　entropy decoding from the bitstream a planar mode flag that indicates whether the volume is planar, wherein the volume is planar if all child sub-volumes containing at least one point are positioned in either the first set or the second set, wherein entropy decoding includes determining a context for decoding the planar mode flag based, in part, on one or more of:
　　　(a) whether a parent volume containing the volume is planar in occupancy,
　　　(b) occupancy of a neighbouring volume at a parent depth, the neighbouring volume being adjacent the volume and having a face in common with the parent volume, or
　　　(c) a distance between the volume and a closest already-coded occupied volume at a same depth as the volume and having a same position on the axis as the volume; and
　　reconstructing occupancy bits for the child sub-volumes.

19. A non-transitory processor-readable medium storing processor-executable instructions to encode a point cloud to generate a bitstream of compressed point cloud data representing a three-dimensional location of an object, the point cloud being located within a volumetric space recursively split into sub-volumes and containing points of the point cloud, wherein a volume is partitioned into a first set of child sub-volumes and a second set of child sub-volumes, the first set of child sub-volumes being positioned in a first plane and the second set of child sub-volumes being positioned in a second plane parallel to the first plane, and wherein an occupancy bit associated with each respective child sub-volume indicates whether that respective child sub-volume contains at least one of the points, both the first plane and the second plane being orthogonal to an axis, wherein the processor-executable instructions, when executed by a processor, are to cause the processor to:
　determine whether the volume is planar based on whether all child sub-volumes containing at least one point are positioned in either the first set or the second set;
　entropy encode in the bitstream a planar mode flag to signal whether the volume is planar, wherein entropy encoding includes determining a context for coding the planar mode flag based, in part, on one or more of:
　　(a) whether a parent volume containing the volume is planar in occupancy,
　　(b) occupancy of a neighbouring volume at a parent depth, the neighbouring volume being adjacent the volume and having a face in common with the parent volume, or
　　(c) a distance between the volume and a closest already-coded occupied volume at a same depth as the volume and having a same position on the axis as the volume;
　encode occupancy bits for at least some of the child sub-volumes; and
　output the bitstream of compressed point cloud data.

20. A non-transitory processor-readable medium storing processor-executable instructions to decode a bitstream of compressed point cloud data to produce a reconstructed point cloud representing a three-dimensional location of a physical object, the point cloud being located within a volumetric space recursively split into sub-volumes and containing points of the point cloud, wherein a volume is partitioned into a first set of child sub-volumes and a second set of child sub-volumes, the first set of child sub-volumes being positioned in a first plane and the second set of child sub-volumes being positioned in a second plane parallel to the first plane, and wherein an occupancy bit associated with each respective child sub-volume indicates whether that respective child sub-volume contains at least one of the points, both the first plane and the second plane being orthogonal to an axis, wherein the processor-executable instructions, when executed by a processor, cause the processor to:
  reconstruct the points of the point cloud by reconstructing the occupancy bits by:
    entropy decoding from the bitstream a planar mode flag that indicates whether the volume is planar, wherein the volume is planar if all child sub-volumes containing at least one point are positioned in either the first set or the second set, wherein entropy decoding includes determining a context for decoding the planar mode flag based, in part, on one or more of:
      (a) whether a parent volume containing the volume is planar in occupancy,
      (b) occupancy of a neighbouring volume at a parent depth, the neighbouring volume being adjacent the volume and having a face in common with the parent volume, or
      (c) a distance between the volume and a closest already-coded occupied volume at a same depth as the volume and having a same position on the axis as the volume; and
    reconstructing occupancy bits for the child sub-volumes.

* * * * *